United States Patent
Chiu et al.

(12) 
(10) Patent No.: US 6,265,317 B1
(45) Date of Patent: Jul. 24, 2001

(54) TOP CORNER ROUNDING FOR SHALLOW TRENCH ISOLATION

(75) Inventors: Hsien-Kuang Chiu, Taoyuan; Fang-Cheng Chen; Hun-Jan Tao, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/756,529

(22) Filed: Jan. 9, 2001

(51) Int. Cl.[7] .................. H01L 21/302; H01L 21/425
(52) U.S. Cl. ............ 438/711; 438/712; 438/729; 438/524; 438/528
(58) Field of Search .................. 438/524, 525, 438/528, 702, 407, 413, 424, 425, 426, 711, 712, 729

(56) References Cited

U.S. PATENT DOCUMENTS

| | | | |
|---|---|---|---|
| 5,179,085 | * | 1/1993 | Bigge et al. .................. 514/114 |
| 5,203,957 | * | 4/1993 | Yoo et al. .................. 156/643 |
| 5,654,232 | * | 8/1997 | Gardner .................. 438/661 |
| 5,837,615 | * | 11/1998 | Rostoker .................. 438/711 |
| 5,874,317 | * | 2/1999 | Stolmeijer .................. 437/67 |
| 5,915,195 | * | 6/1999 | Fulford, Jr. et al. .................. 438/254 |
| 6,074,954 | * | 6/2000 | Lill et al. .................. 438/710 |
| 6,143,666 | * | 11/2000 | Lin et al. .................. 438/725 |

* cited by examiner

Primary Examiner—Michael Lebentritt
(74) Attorney, Agent, or Firm—George O. Saile; Stephen B. Ackerman

(57) ABSTRACT

A process for top-corner rounding at the rim of shallow trenches of the type used for STI is described. This is achieved by first forming the trench using a silicon nitride hard mask having a layer of pad oxide between itself and the silicon surface. The silicon nitride is then briefly and selectively etched so that it pulls back from over the trench rim and exposes a small amount of the underlying pad oxide. Rounding by means of sputtering is then effected with the pad oxide serving to protect the underlying silicon until just before rounding takes place. The result is smoothly rounded corners free of facets and overhangs.

20 Claims, 3 Drawing Sheets

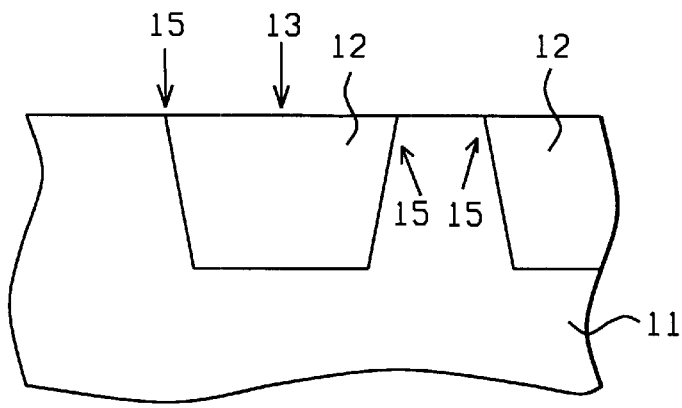
FIG. 1 – Prior Art
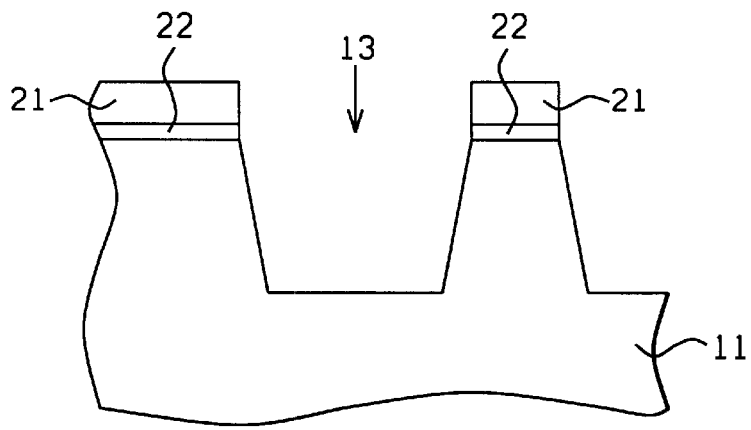
FIG. 2 – Prior Art
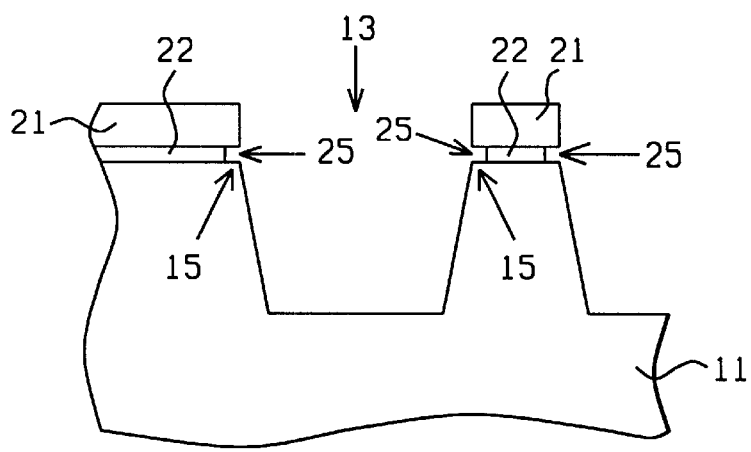
FIG. 3 – Prior Art

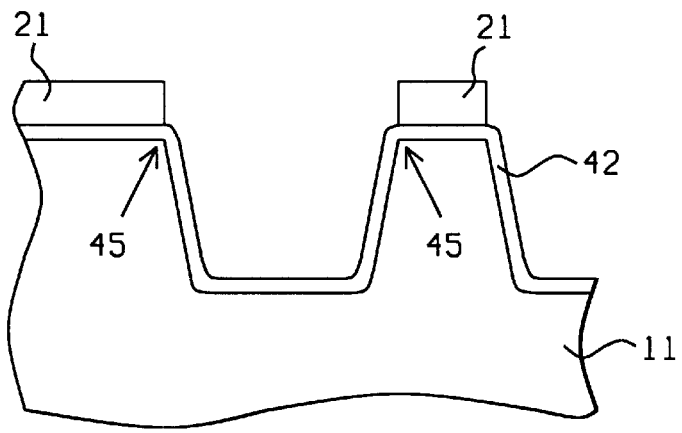
FIG. 4 - Prior Art
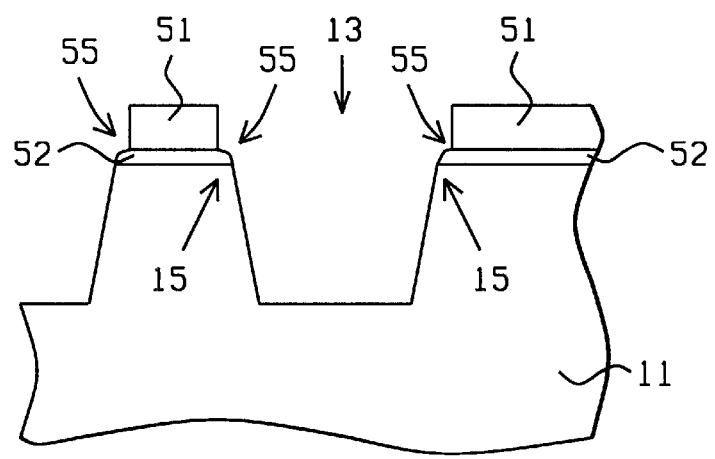
FIG. 5

TOP CORNER ROUNDING FOR SHALLOW TRENCH ISOLATION

FIELD OF THE INVENTION

The invention relates to the general field of shallow trench formation with particular reference to top edge rounding.

BACKGROUND OF THE INVENTION

Shallow trench isolation (STI) is now widely used as means to provide electrical isolation between circuits in a silicon chip. This is illustrated in FIG. 1 which depicts a silicon body 11 in whose upper surface trench 13 has been formed and then filled with dielectric 12. In general, silicon body 11 will include a number of layers and regions that make up integrated circuits (not shown) and dielectric-filled trenches such as 13 serve to isolate these circuits from one another.

Since the walls of trench 13 deviate by only a few degrees from the vertical (typically about 3–5°) they meet the top surface at an angle that is close to 90° making for very sharp corners 15 at the rim of the trench. Sharp corners such as these are highly undesirable because the gate oxide layer cannot then be deposited with uniform thickness, which leads to a deterioration of device electrical performance.

Several processes for smoothing the upper corners of etched trenches have already been described in the prior art. To illustrate one of the more popular among these, we refer now to FIG. 2. Shown there is hard mask 21 of silicon nitride which lies on the top surface of silicon body 11 with an intervening layer 22 of pad oxide (that helps to reduce stress). Layer 21 has already been patterned by standard photolithographic processes into the shape of a mask that defines the opening of trench 13, the latter having then been formed using standard etching processes.

Referring now to FIG. 3, the process of the prior art then selectively etches the layer 22 of pad oxide causing it to pull back from both the top surface of 11 and the undersurface of 21 to form notch 25. This is followed by thermal oxidation of all exposed silicon resulting in the formation of oxide layer 42. Because of a relative increase in oxidation rate at sharp corners 15, at the conclusion of oxidation these corners will have been rounded to become smooth corners 45 as illustrated in FIG. 4.

Although effective to some extent, the above-described smoothing process of the prior art often fails because of the formation of crystal facets and overhangs at the corners instead of the idealized smoothly curved edges shown in FIG. 4.

Thus there remains a need for a fully effective process for rounding the edges at the rim of trenches in silicon. Some of these solutions that have been proposed were found during a routine search of the prior art. For example, in U.S. Pat. No. 5,843,846, Nguyen et al. show a process to round the trench top corners using a sputtering process. A key feature of their process is very careful choice of etch chemistry since it is a requirement that not only the substrate but also the hard mask and photoresist layers get consumed during trench formation. The result is a process in which the dimensions of the trench continue to increase as edge rounding progresses.

In U.S. Pat. No. 5,837,615, Rostoker discloses a process for forming high aspect ratio trenches using sputtering. The slope of the trench's side walls is determined by the slope of the mask's sidewalls so top edge rounding is achieved by first rounding the oxide over the substrate rather than the trench sidewall. In U.S. Pat. No. 5,915,195, Fulford Jr. et al. describe an ion implantation process to improve gate oxide quality at the edge of a shallow trench. Meng et al. in U.S. Pat. No. 5,453,403 teach that sputtering in argon smooths out sharp edges, such edges being fully exposed during sputtering, while Stolmeijer (U.S. Pat. No. 5,874,317) shows a process to round trench corners and Moon et al. (U.S. Pat. No. 5,179,085) show a STI process.

SUMMARY OF THE INVENTION

It has been an object of the present invention to provide a process for rounding the edges at the rim of a trench formed within a silicon body.

Another object of the invention has been that the dimensions of the trench not be changed as a by-product of said process.

A further object has been that, after rounding, there be no facets or overhangs at said rim edges.

These objects have been achieved by first forming the trench using a silicon nitride hard mask having a layer of pad oxide between itself and the silicon surface. The silicon nitride is then briefly and selectively etched so that it pulls back from over the trench rim and exposes a small amount of the pad oxide. Rounding by means of sputtering is then effected with the pad oxide serving to protect the underlying silicon until just before rounding takes place. The result is smoothly rounded corners free of facets and overhangs.

BRIEF DESCRIPTION OF THE DRAWINGS

FIG. 1 shows a shallow trench in silicon that has been filled with a dielectric.

FIG. 2 illustrates the process of trench formation.

FIGS. 3 and 4 illustrate a process of the prior art which achieves top corner rounding through thermal oxidation.

FIG. 5 illustrates how silicon nitride is selectively pulled back from over the pad oxide prior to top corner rounding.

DESCRIPTION OF THE PREFERRED EMBODIMENTS

Figure 6:
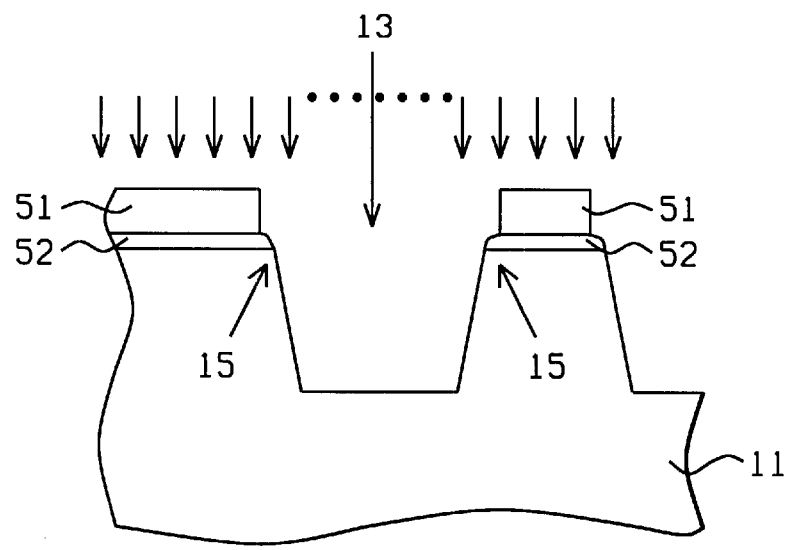
FIG. 6 shows the sputtering of the structure seen in FIG. 5.

While we will describe the process of the present invention in terms of a trench in silicon, particularly one used to isolate between integrated circuits, it will be understood that the process is more general than this and could be applied to smoothing out any sharp step that has been formed in the surface of a silicon body.

The starting point for the process of the present invention is illustrated in FIG. 2. As before, hard mask 21 of silicon nitride lies on the top surface of silicon body 11 with an intervening layer 22 of pad oxide having a thickness between about 80 and 250 Angstroms. Layer 21 has already been patterned using a photoresist mask (not shown) to itself become a mask that defines the surface dimensions of trench 131 the latter having then been formed using standard etching processes. Optionally, the layer of photoresist used to pattern the hard mask could be removed at this time.

Referring now to FIG. 5, the next step, which represents a departure from prior art practice, is the selective etching of silicon nitride layer 51 which causes this layer to be pulled back a small amount (between about 100 and 250 Angstroms) from over the trench rim thereby exposing that amount of pad oxide 52 as pointed to by arrow 55. Silicon nitride pullback may be effected using wet or dry etching. For the former case we used 80–100% phosphoric acid at 100–200° C. Etch time was carefully controlled to be between about 1 and 10 minutes.

To cause pullback of the silicon nitride using a dry etch, we used tetrafluoro methane or sulfur hexafluoride, with oxygen, at a total pressure between about 5 and 1,000 mtorr and a flow rate between about 10 and 100 SCCM at a temperature between about 0 and 60° C. As in the wet etch case, etch time was carefully controlled to be between about 10 and 100 seconds.

Figure 7:
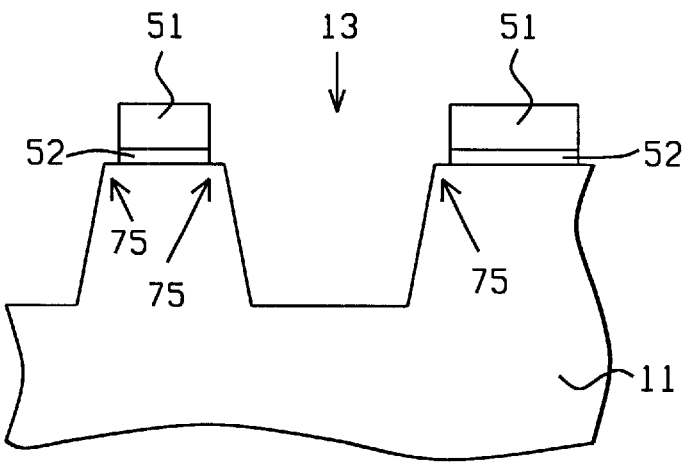
FIG. 7 shows the end product at the conclusion of the process of the present invention.

Then (as shown in FIG. 6), with layer 52 initially protecting edges 15 at the trench rim, the exposed portions 55 of pad oxide layer 52 was removed through sputtering, as schematically illustrated by arrows 61. Sputtering was achieved by using argon at a pressure between about 10 and 1,000 mtorr and a power level between about 200 and 1,000 watts for between about 10 and 100 seconds. Sputtering was allowed to continue briefly past the point when the exposed portions of layer 52 had been removed, resulting in rounded trench rim edges 75 as shown in FIG. 7.

The initial presence of protective layer 52 during the rounding of the trench's upper corners is a key feature of the invention. The role of layer 52 during the rounding process is to prevent serious damage to the top corner of the silicon surface. It will get removed during the sputtering process that follows. Furthermore, because the silicon surface is protected by layer 52 during all but the final stages of the smoothing process, the dimensions of trench 13 are not changed as a result of edge corner rounding.

The process concludes with removal of the layer of photoresist (if it was not already removed after formation of the hard mask), followed by a dip in a hydrofluoric solution. This cleans up any sputtered material that has settled back onto the surface during processing. Dipping was for between about 10 and 60 seconds in a hydrofluoric solution whose concentration was between about 30 and 100%.

While the invention has been particularly shown and described with reference to the preferred embodiments thereof, it will be understood by those skilled in the art that various changes in form and details may be made without departing from the spirit and scope of the invention.

What is claimed is:

1. A process for smoothing an edge, comprising:
   providing a silicon body having a first upper surface that includes a step, having a sharp edge, down to a second upper surface;
   forming on said upper surface a layer of silicon oxide and then forming a layer of silicon nitride on said layer of silicon oxide;
   selectively etching the silicon nitride whereby between about 100 and 250 Angstroms of the silicon oxide is exposed; and
   through sputtering, removing said exposed silicon oxide whereby said sharp edge becomes a rounded edge.

2. The process described in claim 1 wherein the step of selectively etching the silicon nitride is performed using a wet etch or a dry etch.

3. The process described in claim 1 wherein the layer of silicon oxide has a thickness between about 30 and 250 Angstroms.

4. The process described in claim 1 wherein sputtering is performed in argon at a pressure between about 5 and 1,000 mtorr and a power level between about 150 and 500 watts for between about 10 and 60 seconds.

5. A process for rounding top corners of a trench, comprising the sequential steps of:
   providing a silicon body having an upper surface;
   forming a layer of pad oxide on said upper surface;
   depositing a layer of silicon nitride on the layer of pad oxide;
   depositing a layer of photoresist on the layer of silicon nitride and then patterning the photoresist to form a mask;
   using said photoresist mask, etching the silicon nitride thereby forming a hard mask that defines a trench having dimensions;
   using the hard mask, etching through the layer of pad oxide into the silicon body to a preset depth, thereby forming the trench, said trench having a rim;
   using a wet etch, selectively etching the silicon nitride for a time period whereby silicon nitride is pulled back from above said trench rim and between about 100 and 250 Angstroms of the pad oxide is exposed;
   through sputtering, removing said exposed pad oxide and then rounding the trench rim without changing the dimensions of the trench; and
   dipping the silicon body in a hydrofluoric solution thereby performing a cleanup etch.

6. The process described in claim 5 wherein said silicon body contains integrated circuits, said trench depth is between about 0.25 and 0.5 microns, and further comprising filling the trench with dielectric material in order to provide shallow trench isolation between said circuits.

7. The process described in claim 5 wherein sputtering is performed in argon at a pressure between about 5 and 1,000 mtorr and a power level between about 150 and 500 watts for between about 10 and 60 seconds.

8. The process described in claim 5 wherein the step of using a wet etch further comprises using 80 to 100% phosphoric acid at a temperature between about 100 and 200° C., with said time period being between about 1 and 10 minutes.

9. The process described in claim 5 wherein the layer of pad oxide has a thickness between about 80 and 250 Angstroms.

10. The process described in claim 5 further comprising removing the layer of photoresist prior to etching through the layer of pad oxide into the silicon body.

11. The process described in claim 5 further comprising removing the layer of photoresist after the sputtering step.

12. The process described in claim 5 wherein the step of dipping the silicon body in a hydrofluoric solution further comprises dipping for between about 10 and 100 seconds in a hydrofluoric solution whose concentration is between about 10 and 100%.

13. A process for rounding top corners of a trench, comprising the sequential steps of:
   providing a silicon body having an upper surface;
   forming a layer of pad oxide on said upper surface;
   depositing a layer of silicon nitride on the layer of pad oxide;
   depositing a layer of photoresist on the layer of silicon nitride and then patterning the photoresist to form a mask;
   using said photoresist mask, etching the silicon nitride thereby forming a hard mask that defines a trench having dimensions;
   using the hard mask, etching through the layer of pad oxide into the silicon body to a preset depth, thereby forming the trench, said trench having a rim;

using a dry etch, selectively etching the silicon nitride for a time period whereby silicon nitride is pulled back from above said trench rim and between about 100 and 250 Angstroms of the pad oxide is exposed;

through sputtering, removing said exposed pad oxide and then rounding the trench rim without changing the dimensions of the trench; and dipping the silicon body in a hydrofluoric solution thereby performing a cleanup etch.

14. The process described in claim 13 wherein said silicon body contains integrated circuits, said trench depth is between about 0.25 and 0.5 microns, and further comprising filling the trench with dielectric material in order to provide shallow trench isolation between said circuits.

15. The process described in claim 13 wherein sputtering is performed in argon at a pressure between about 5 and 1,000 mtorr and a power level between about 150 and 500 watts for between about 10 and 60 seconds.

16. The process described in claim 13 wherein the step of using a dry etch further comprises using tetrafluoro methane or sulfur hexafluoride, with oxygen, at a total pressure between about 5 and 1,000 mtorr and a flow rate between about 10 and 100 SCCM at a temperature between about 0 and 60° C., with said time period being between about 10 and 100 seconds.

17. The process described in claim 13 wherein the layer of pad oxide has a thickness between about 80 and 250 Angstroms.

18. The process described in claim 13 further comprising removing the layer of photoresist prior to etching through the layer of pad oxide into the silicon body.

19. The process described in claim 13 further comprising removing the layer of photoresist after the sputtering step.

20. The process described in claim 13 wherein the step of dipping the silicon body in a hydrofluoric solution further comprises dipping for between about 10 and 100 seconds in a hydrofluoric solution whose concentration is between about 10 and 100%.

* * * * *